(12) United States Patent
Wei et al.

(10) Patent No.: US 10,861,834 B2
(45) Date of Patent: Dec. 8, 2020

(54) MICRO-LED CHIPS, DISPLAY SCREENS AND METHODS OF MANUFACTURING THE SAME

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Dong Wei, Kunshan (CN); Rubo Xing, Kunshan (CN); Huimin Liu, Kunshan (CN); Xiaolong Yang, Kunshan (CN); Jiantai Wang, Kunshan (CN)

(*) Notice: Subject to any disclaimer, the term of this patent is extended or adjusted under 35 U.S.C. 154(b) by 0 days.

(21) Appl. No.: 16/413,632

(22) Filed: May 16, 2019

(65) Prior Publication Data

US 2019/0267360 A1 Aug. 29, 2019

Related U.S. Application Data

(63) Continuation of application No. PCT/CN2018/089084, filed on May 30, 2018.

(30) Foreign Application Priority Data

Mar. 8, 2018 (CN) .......................... 2018 1 0191229

(51) Int. Cl.
*H01L 25/075* (2006.01)
*H01L 33/06* (2010.01)
(Continued)

(52) U.S. Cl.
CPC .......... *H01L 25/0753* (2013.01); *G09G 3/32* (2013.01); *H01L 33/007* (2013.01); *H01L 33/06* (2013.01);
(Continued)

(58) Field of Classification Search
CPC ... H01L 25/0753; H01L 33/06; H01L 33/007; H01L 33/62; H01L 33/38;
(Continued)

(56) References Cited

U.S. PATENT DOCUMENTS

| | | | | |
|---|---|---|---|---|
| 8,492,785 B2* | 7/2013 | Hodota | ................. | H01L 33/405 |
| | | | | 257/103 |
| 8,557,616 B2* | 10/2013 | Lau | ..................... | H01L 27/1214 |
| | | | | 438/28 |

(Continued)

FOREIGN PATENT DOCUMENTS

| | | |
|---|---|---|
| CN | 103117264 A | 5/2013 |
| CN | 103403889 A | 11/2013 |

(Continued)

OTHER PUBLICATIONS

TW First Office Action dated Jan. 11, 2019 in the corresponding TW application (application No. 107121964).

(Continued)

*Primary Examiner* — Vu A Vu
(74) *Attorney, Agent, or Firm* — Kilpatrick Townsend & Stockton (57) ABSTRACT

A method for manufacturing a micro-LED display screen includes: forming an N-type GaN layer, a quantum-well light-emitting layer, and a P-type GaN layer on a sapphire substrate sequentially; etching the P-type GaN layer, the quantum-well light-emitting layer, and the N-type GaN layer from top to bottom, to form a first trench; forming an ITO layer on the surface of the P-type GaN layer, and etching the ITO layer to form a second trench; generating an N-type contact electrode in the first trench; generating a reflective electrode having a longitudinal cross-section in a shape with a wide upper side and a narrow lower side, respectively, on an upper surface of the N-type contact electrode and in the second trench; depositing an insulating layer on a surface of (Continued)

the micro-LED chip, and etching the insulating layer to expose the reflective electrodes; and soldering a driving circuit substrate to the reflective electrode.

8 Claims, 6 Drawing Sheets

(51) Int. Cl.
  *H01L 33/00* (2010.01)
  *G09G 3/32* (2016.01)
  *H01L 33/62* (2010.01)
  *H01L 33/38* (2010.01)

(52) U.S. Cl.
  CPC .............. *H01L 33/38* (2013.01); *H01L 33/62* (2013.01); *H01L 2933/0016* (2013.01); *H01L 2933/0033* (2013.01)

(58) Field of Classification Search
  CPC ..... H01L 2933/0016; H01L 2933/0033; H01L 33/44; H01L 33/405; H01L 33/42; G09G 3/32
  USPC .......................................................... 257/88
  See application file for complete search history.

(56) References Cited

U.S. PATENT DOCUMENTS

| | | | | |
|---|---|---|---|---|
| 8,653,551 | B2* | 2/2014 | Fujimori | H01L 33/405 |
| | | | | 257/98 |
| 9,059,152 | B2 | 6/2015 | Inoue et al. | |
| 9,059,356 | B1* | 6/2015 | Miller | H01L 33/06 |
| 9,324,904 | B2 | 4/2016 | Yang et al. | |
| 9,825,014 | B2 | 11/2017 | Cha et al. | |
| 2013/0320382 | A1* | 12/2013 | Kojima | H01L 33/62 |
| | | | | 257/98 |
| 2014/0252598 | A1 | 9/2014 | Yu et al. | |
| 2015/0097202 | A1 | 4/2015 | Cheng et al. | |

FOREIGN PATENT DOCUMENTS

| | | |
|---|---|---|
| CN | 103594584 A | 2/2014 |
| CN | 104037143 A | 9/2014 |
| CN | 104124311 A | 10/2014 |
| CN | 105552180 A | 5/2016 |
| CN | 105655461 A | 6/2016 |
| CN | 106025010 A | 10/2016 |
| CN | 106169528 A | 11/2016 |
| CN | 106847796 A | 6/2017 |
| CN | 106935609 A | 7/2017 |
| CN | 107146835 A | 9/2017 |
| CN | 206595248 U | 10/2017 |
| CN | 107680983 A | 2/2018 |
| KR | 20150078296 A | 7/2015 |
| TW | 201424042 A | 6/2014 |
| TW | 201511042 A | 3/2015 |
| TW | 201642496 A | 12/2016 |
| TW | 201733105 A | 9/2017 |
| WO | 2014203829 A1 | 12/2014 |
| WO | 2015102225 A1 | 7/2015 |

OTHER PUBLICATIONS

TW Second Office Action dated Apr. 15, 2019 in the corresponding TW application (application No. 107121964).
CN First Office Action dated Jan. 6, 2020 in the corresponding CN application (application No. 201810191229.6).

* cited by examiner

MICRO-LED CHIPS, DISPLAY SCREENS AND METHODS OF MANUFACTURING THE SAME

CROSS-REFERENCES TO RELATED APPLICATIONS

This application is a continuation application to International Application No. PCT/CN2018/089084, filed on May 30, 2018, which claims the priority to Chinese Patent Application No. 201810191229.6, entitled "MICRO-LED CHIP, DISPLAY SCREEN AND METHOD OF MANUFACTURING THE SAME", and filed on Mar. 8, 2018. The entireties of both applications are incorporated by reference herein for all purposes.

FIELD

Exemplary embodiments of the present disclosure relate to the technical field of LED display, and more particularly, to micro-LED chips, display screens and methods of manufacturing the same.

BACKGROUND

Micro light emitting diode display (micro-LED display) is a new generation of display technology. Arrays of microscopic LEDs are employed in a micro-LED Display, that is, the structure of the LED is thinned, miniaturized and arrayed, so that the micro-LED has a volume decreasing to about 1% of a current mainstream LED. Each pixel in the micro-LED display is capable to be addressed, and individually driven to emit light, to reduce a distance between pixels from an original millimeter-scale to a micron-scale. The advantages of the micro-LED include low power consumption, high brightness, ultra-high resolution and color saturation, fast response, ultra-power saving, long life, high efficiency, and others. The power consumption of the micro-LED is about 10% of LCD, and 50% of OLED. Compared with the OLED, which is also self-emissive, the micro-LED has a brightness value 30 times greater than the OLED, and the micro-LED has a resolution up to 1500 PPI (Pixels per Inch), which is equivalent to 5 times the resolution of 300 PPI for an OLED panel used in an Apple Watch. In addition, the micro-LED has a better performance in material stability and no image burn-in.

For an existing micro-LED display, the number of dead pixels caused by soldering invalidation may be increased.

SUMMARY

In order to solve the deficiencies of the prior art, exemplary embodiments of the present disclosure provide micro-LED chips, display screens, and methods of manufacturing the same, to prevent the soldering invalidation when a micro-LED chip is soldered to the driving circuit substrate.

According to an aspect of an exemplary embodiment of the present disclosure, a micro-LED chip is provided, including a sapphire substrate, an N-type GaN layer, a quantum-well light-emitting layer, a P-type GaN layer, an ITO layer, an N-type contact electrode, a reflective electrode, and an insulating layer. The reflective electrode has a longitudinal cross-section in a shape with a wide upper side and a narrow lower side, and an upper surface of the reflective electrode is higher than an upper surface of the ITO layer.

In an exemplary embodiment, the N-type contact electrode is located on an upper surface of the N-type GaN layer, and an upper surface of the N-type contact electrode and an upper surface of the P-type GaN layer are at a same height.

In an exemplary embodiment, the insulating layer is located on an upper surface of the micro-LED chip, and a height of the insulating layer is higher than a height of the reflective electrode.

In an exemplary embodiment, the shape of the longitudinal section of the reflective electrode is an inverted trapezoid.

According to another aspect of an exemplary embodiment of the present disclosure, a micro-LED display screen is provided, including a micro-LED chip according to the above aspect, and a driving circuit substrate. The driving circuit substrate is soldered to the reflective electrode of the micro-LED chip.

In order to achieve the above object, the present disclosure provides a method of manufacturing a micro-LED display screen, including:

forming an N-type GaN layer, a quantum-well light-emitting layer, and a P-type GaN layer on the sapphire substrate sequentially;

etching the P-type GaN layer, the quantum-well light-emitting layer, and the N-type GaN layer in order from top to bottom to form a first trench;

forming an ITO layer on an upper surface of the P-type GaN layer, and etching the ITO layer to form a second trench;

generating an N-type contact electrode in the first trench;

generating a reflective electrode having a longitudinal cross-section in a shape with a wide upper side and a narrow lower side, respectively, on the upper surface of the N-type contact electrode and in the second trench;

depositing an insulating layer on a surface of the micro-LED chip, and etching the insulating layer to expose the reflective electrode; and soldering a driving circuit substrate to the reflective electrode.

In an exemplary embodiment, the generating the N-type contact electrode in the first trench includes generating the N-type contact electrode at bottom of the first trench, such that the upper surface of the N-type contact electrode and the upper surface of the P-type GaN layer are at a same height.

In an exemplary embodiment, the depositing the insulating layer on the surface of the micro-LED chip includes depositing the insulating layer on the surface of the micro-LED chip, such that an upper surface of the insulating layer is higher than the upper surface of the reflective electrode.

In an exemplary embodiment, the shape of the longitudinal section of the reflective electrode is an inverted trapezoid.

Micro-LED chips, display screens and the method of manufacturing a micro-LED display screen according to exemplary embodiments of the present disclosure use an inverted trapezoidal electrode as an bonding pad, so the bonding strength of the micro-LED chip for soldering is improved. In this way, not only the soldering invalidation when the micro-LED chip is soldered to the screen substrate is addressed, but also the occurrence probability of abnormalities when the micro-LED chip is soldered to the driving circuit substrate is reduced, thereby improving the process yield of the Micro-LED display, and reducing the production cost.

Other characteristics and advantages of the present disclosure will be described in the following specification, and will be apparent partly from the specification and implementations of the present disclosure.

BRIEF DESCRIPTION OF THE DRAWINGS

The drawings are intended to provide a further understanding of the present disclosure, and constitute a part of the specification. The exemplary embodiments of the present disclosure and the explanation thereof are given thereafter by way of illustration only, and thus are not limitative of the present disclosure, and wherein.

DETAILED DESCRIPTION OF THE INVENTION

For an existing micro-LED display, as the size of the LED chip is reduced, the size of the bonding pad is also reduced exponentially, so that the bonding force between the chip and the screen substrate soldered to the chip is reduced, and the probability of soldering invalidation of the LED chip is increased, which eventually leads to an exponential increase in the number of dead pixels on the micro-LED display. There is a higher requirement on the bonding force during the use of a flexible, folded, or stretched micro-LED display, so the number of dead pixels caused by soldering invalidation may be increased.

Hereinafter, preferred exemplary embodiments of the present disclosure will be described in reference to the accompanying drawings. It should be understood that the preferred exemplary embodiments herein are used merely to illustrate and explain rather than to limit the exemplary embodiments of the disclosure.

Figure 1:
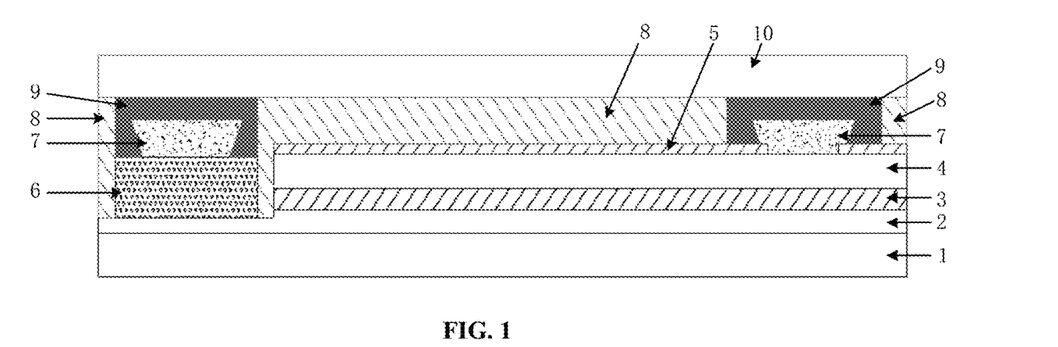
FIG. 1 is a structural schematic diagram illustrating a micro-LED display screen according to an exemplary embodiment of the present disclosure.

FIG. 1 is a structural schematic diagram illustrating a micro-LED display screen according to an exemplary embodiment of the present disclosure. As shown in FIG. 1, in this exemplary embodiment, the micro-LED display screen includes a micro-LED chip, and a driving circuit substrate 10 soldered to the micro-LED chip through solder. The micro-LED chip includes a sapphire substrate 1, an N-type GaN layer 2, a quantum-well light-emitting layer 3, a P-type GaN layer 4, an ITO layer 5, an N-type contact electrode 6, a reflective electrode 7, and an insulating layer 8.

An N-type GaN layer 2 is formed over the sapphire substrate 1. The N-type GaN layer 2 includes a first region suitable for forming the N-type contact electrode 6, and a second region. The quantum-well light-emitting layer 3 and the P-type GaN layer 4 are sequentially formed on the second region of the N-type GaN layer 2.

The ITO layer 5 is located on an upper surface of the P-type GaN layer 4.

The N-type contact electrode 6 is located on an upper surface of the first region of the N-type GaN layer 2, and an upper surface of the N-type contact electrode 6 is at the same height as an upper surface of the P-type GaN layer 4, so that the N-type contact electrode 6 can be in better contact with the solder.

There are two reflective electrodes 7, one is located on the upper surface of the N-type contact electrode 6, and the other is located on the upper surface of the P-type GaN layer 4. An upper surface of each of the reflective electrodes 7 is higher than an upper surface of the ITO layer 5, and has a longitudinal cross-section in a shape with a wide upper side and a narrow lower side, thereby increasing the contact area of the reflective electrode 7 with the solder and increasing the bonding force of the micro-LED chip, which solves the problem that the soldering invalidation is easily to occur when the micro-LED chip is soldered to the driving circuit substrate 10. In this exemplary embodiment, the shape of the longitudinal cross-section of the reflective electrode 7 is an inverted trapezoid, but in other exemplary embodiments, any suitable shape with a wide upper side and a narrow lower side may be employed.

The insulating layer 8 is located on an upper surface of the micro-LED chip, with a height higher than a height of the reflective electrode 7, so that it can prevent the solder from overflowing to a surface of the micro-LED chip, and avoid direct conduction between the P electrode and the N electrode.

Figure 2:
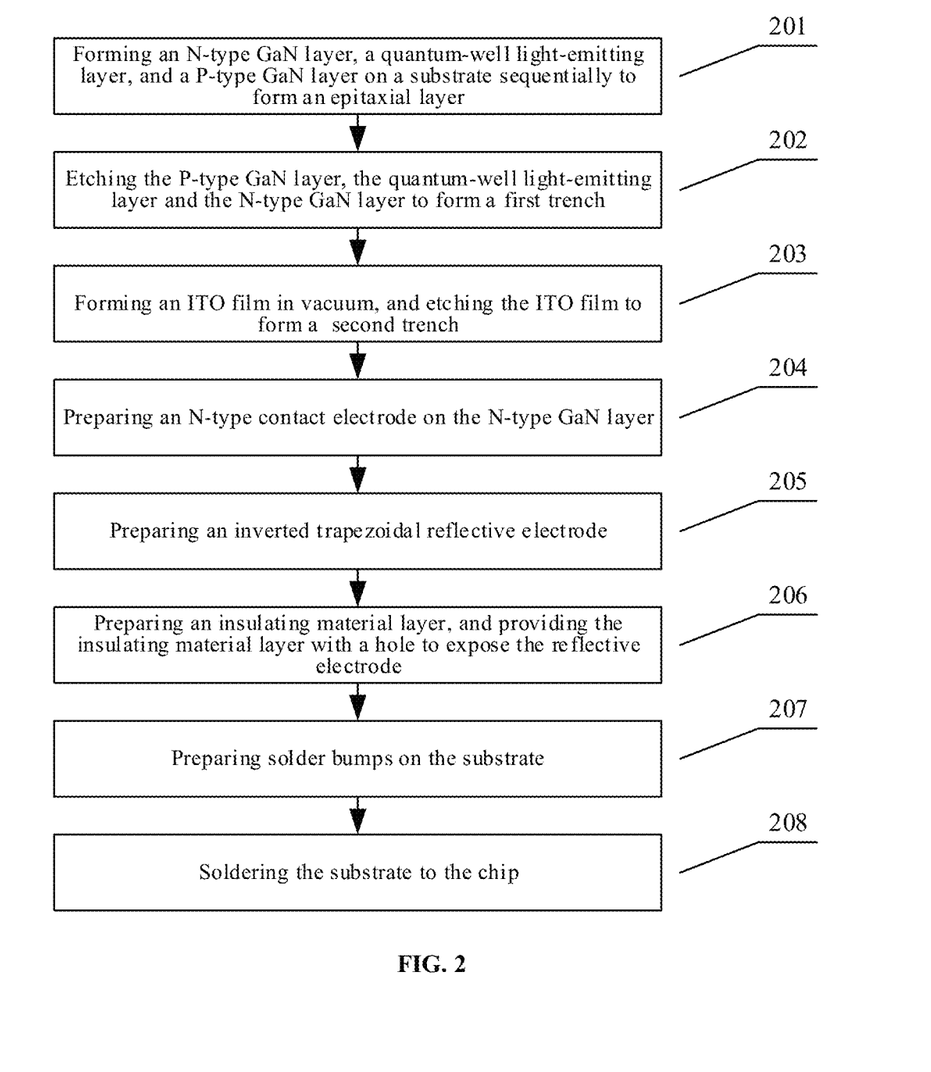
FIG. 2 is a flow diagram illustrating a method of manufacturing a micro-LED display screen according to an exemplary embodiment of the present disclosure.

FIG. 2 is a flow diagram illustrating a method of manufacturing a micro-LED display screen according to an exemplary embodiment of the present disclosure. The method of manufacturing the micro-LED display screen will be described in detail below with reference to FIG. 2.

Figure 3:
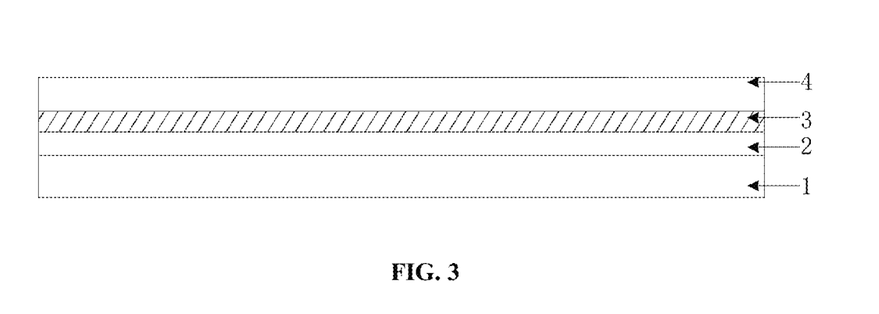
FIG. 3 is a structural schematic diagram of a longitudinal cross-section showing an epitaxial layer formed according to an exemplary embodiment of the present disclosure.

First, in step 201, an N-type GaN layer 2, a quantum-well light-emitting layer 3, and a P-type GaN layer 4 are formed on the sapphire substrate 1 sequentially, to form an epitaxial layer of the micro-LED chip. FIG. 3 is a structural schematic diagram of a longitudinal cross-section showing an epitaxial layer formed according to an exemplary embodiment of the present disclosure. As shown in FIG. 3, the epitaxial layer of the micro-LED chip includes the N-type GaN layer 2, the quantum-well light-emitting layer 3, and the P-type GaN layer 4 sequentially from bottom to top.

Figure 4:
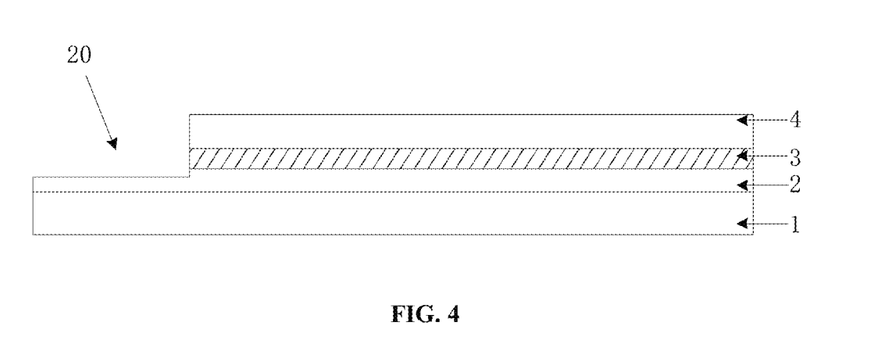
FIG. 4 is a structural schematic diagram of a longitudinal cross-section showing a first trench formed in an epitaxial layer according to an exemplary embodiment of the present disclosure.

At step 202, the P-type GaN layer 4, the quantum-well light-emitting layer 3, and the N-type GaN layer 2 are etched in a region of the epitaxial layer of the micro-LED chip from top to bottom, to form a first trench 20. In this step, the N-type GaN layer 2 is partially etched. FIG. 4 is a structural schematic diagram of a longitudinal cross-section showing a first trench formed in an epitaxial layer according to an exemplary embodiment of the present disclosure. As shown in FIG. 4, the first trench 20 passes through the P-type GaN layer 4 and the quantum-well light-emitting layer 3, and reaches the N-type GaN layer 2.

Figure 5:
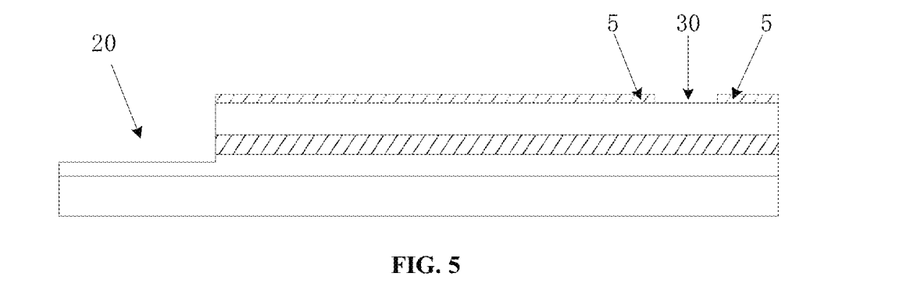
FIG. 5 is a structural schematic diagram of a longitudinal cross-section showing a second trench formed in an ITO layer according to an exemplary embodiment of the present disclosure.

In step 203, an ITO layer 5 (ITO film) is formed on the P-type GaN layer 4, and is etched to expose the P-type GaN layer 4 to form a second trench 30. FIG. 5 is a structural schematic diagram of a longitudinal cross-section showing a second trench formed in an ITO layer according to an exemplary embodiment of the present disclosure. As shown in FIG. 5, the ITO layer 5 is located on an upper surface of the P-type GaN layer 4, and the P-type GaN layer 4 is located at the bottom of the second trench 30.

Figure 6:
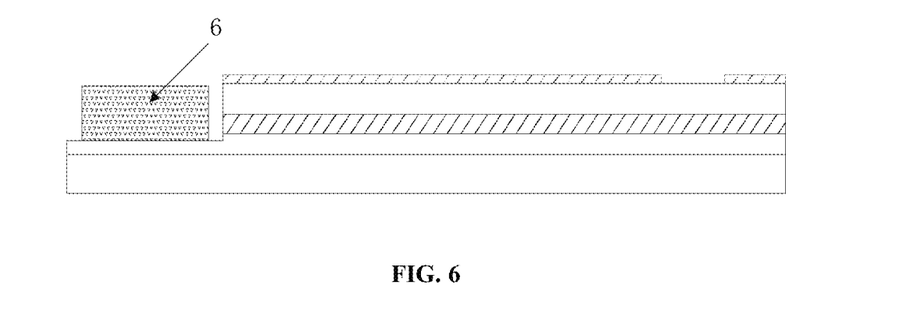
FIG. 6 is a structural schematic diagram of a longitudinal cross-section showing an N-type contact electrode formed in the first trench according to an exemplary embodiment of the present disclosure.

At step 204, an N-type contact electrode 6 is formed at the bottom of the first trench 20. FIG. 6 is a structural schematic diagram of a longitudinal cross-section showing an N-type contact electrode formed in a first trench according to an exemplary embodiment of the present disclosure. As shown in FIG. 6, the formed N-type contact electrode 6 has a horizontal width smaller than a horizontal width of the first trench 20, and has an upper surface at a same height as the P-type GaN layer 4.

Figure 7:
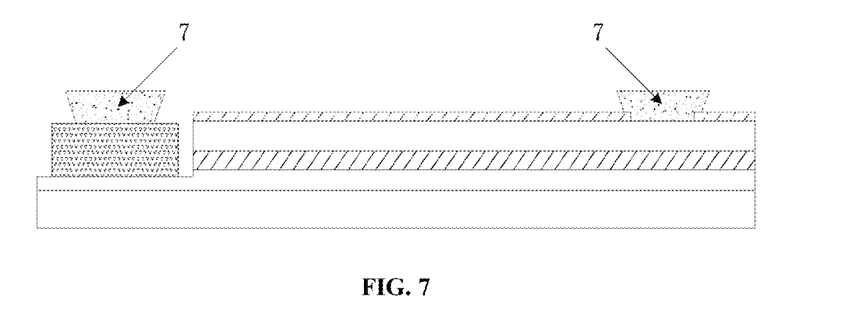
FIG. 7 is a structural schematic diagram of a longitudinal cross-section showing a reflective electrode formed on an N-type contact electrode and in the second trench, respectively, according to an exemplary embodiment of the present disclosure.

At step 205, a reflective electrode 7 is formed on the upper surface of the N-type contact electrode 6 and in the second trench, respectively. FIG. 7 is a structural schematic diagram of a longitudinal cross-section showing a reflective electrode formed on the N-type contact electrode and in the second trench, respectively, according to an exemplary embodiment of the present disclosure. As shown in FIG. 7, the formed reflective electrode 7 has a longitudinal cross-section in an inverted trapezoidal shape with an upper surface higher than the ITO layer 5.

Figure 8:
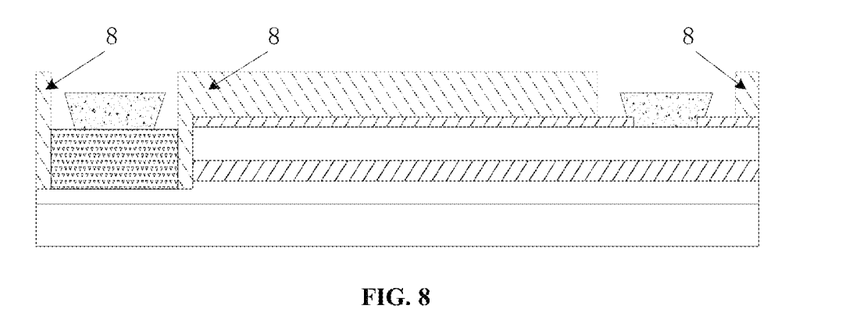
FIG. 8 is a structural schematic diagram of a longitudinal cross-section showing a micro-LED chip according to an exemplary embodiment of the present disclosure.

At step 206, an insulating material is deposited to form an insulating layer 8 on the upper surface of the micro-LED chip, and then the insulating layer 8 is provided with holes to expose the reflective electrodes 7. FIG. 8 is a structural schematic diagram of a longitudinal cross-section showing a micro-LED chip according to an exemplary embodiment of the present disclosure. As shown in FIG. 8, the height of the insulating layer 8 is higher than the height of the reflective electrode 7, and two reflective electrodes 7 are exposed out of the holes.

Figure 9:
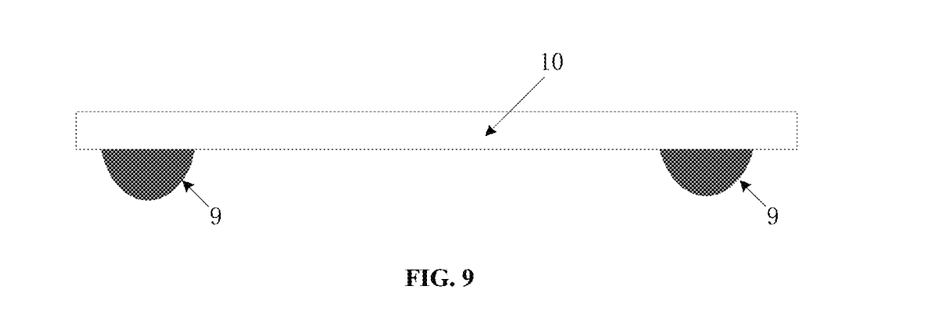
FIG. 9 is a structural schematic diagram of a longitudinal cross-section showing a driving circuit substrate with solder bumps according to an exemplary embodiment of the present disclosure.

At step 207, solder bumps 9 are formed at bottom of a driving circuit substrate 10. FIG. 9 is a structural schematic longitudinal cross-section showing a driving circuit substrate with solder bumps according to an exemplary embodiment of the present disclosure. As shown in FIG. 9, two solder bumps 9 are formed at bottom of the driving circuit substrate 10, corresponding to openings of the holes in the insulating layer 8, respectively. The volume of each solder bump 9 needs to be equal to or slightly smaller than the volume of the hole in the insulating layer 8, so that each solder bump 9 can be completely filled into the hole, to prevent the solder from overflowing from the hole, and avoid direct conduction between the P electrode and the N electrode.

Figure 10:
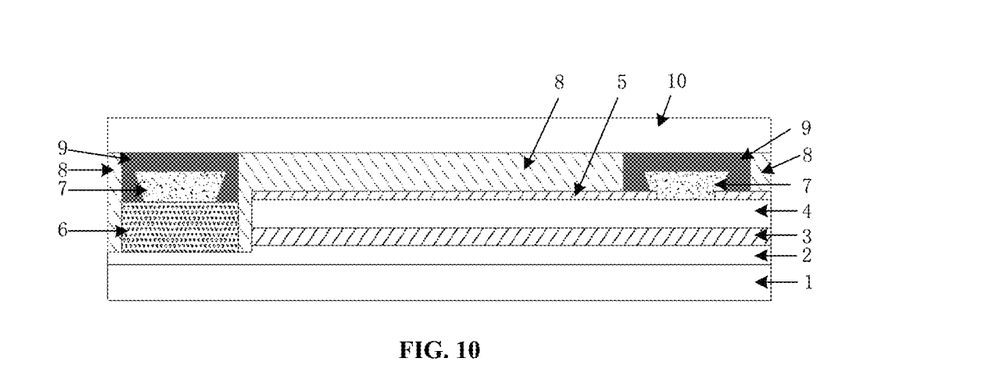
FIG. 10 is a structural schematic diagram of a longitudinal cross-section showing a micro-LED chip soldered together with a driving circuit substrate according to an exemplary embodiment of the present disclosure.

In step 208, the driving circuit substrate 10 is placed on the upper surface of the insulating layer 8, and the driving circuit substrate 10 is soldered on the inverted trapezoidal reflective electrode 7 through the solder bumps 9, thereby completing the manufacture of the micro-LED display screen. FIG. 10 is a structural schematic diagram of a longitudinal cross-section showing a micro-LED chip soldered together with a substrate according to an exemplary embodiment of the present disclosure. As shown in FIG. 10, solder forms a solder joint around the inverted trapezoidal reflective electrode 7, so that the micro-LED chip is soldered together with the diving circuit substrate.

The description above is only preferred exemplary embodiments of the present disclosure and is not intended to limit the present disclosure. A micro-LED chip according to an exemplary embodiment of the present disclosure can be used to manufacture a micro-LED display screen, particularly a flexible, folded, or stretched micro-LED display. For those skilled in the art, the technical solutions described in the above exemplary embodiments may be modified, or some of the technical features may be equivalently replaced. Any modifications, equivalent substitutions, improvements, etc., made within the spirit and principle of the present disclosure, are all included in the scope of the present disclosure.

The invention claimed is:

1. A micro-LED chip, comprising:
    a sapphire substrate;
    an N-type GaN layer;
    a quantum-well light-emitting layer;
    a P-type GaN layer;
    an ITO layer;
    an N-type contact electrode;
    a reflective electrode formed on a portion of an upper surface of the P-type GaN layer; and
    an insulating layer;
    wherein
    the reflective electrode includes a longitudinal cross-section having a wide upper side and a narrow lower side, and
    an upper surface of the reflective electrode is positioned higher than an upper surface of the ITO layer,
    wherein a shape of the longitudinal cross-section of the reflective electrode is an inverted trapezoid.

2. The micro-LED chip according to claim 1, wherein the N-type contact electrode is located on an upper surface of the N-type GaN layer, and an upper surface of the N-type contact electrode and an upper surface of the P-type GaN layer are at a same height.

3. The micro-LED chip according to claim 1, wherein the insulating layer is located on an upper surface of the micro-LED chip, and a height of the insulating layer is higher than a height of the reflective electrode.

4. A micro-LED display screen, comprising a micro-LED chip, and a driving circuit substrate, the micro-LED chip comprising a sapphire substrate, an N-type GaN layer, a quantum-well light-emitting layer, a P-type GaN layer, an ITO layer, an N-type contact electrode, a reflective electrode formed on a portion of an upper surface of the P-type GaN layer, and an insulating layer, the reflective electrode having a longitudinal cross-section with a wide upper side and a narrow lower side, and an upper surface of the reflective electrode being higher than an upper surface of the ITO layer, wherein a shape of the longitudinal cross-section of the reflective electrode is an inverted trapezoid.

5. A method of manufacturing a micro-LED display screen, comprising:
    providing a sapphire substrate;
    forming an N-type GaN layer, a quantum-well light-emitting layer, and a P-type GaN layer on the sapphire substrate sequentially;
    etching the P-type GaN layer, the quantum-well light-emitting layer, and the N-type GaN layer in order from top to bottom, to form a first trench;

forming an ITO layer on an upper surface of the P-type GaN layer, and etching the ITO layer to form a second trench exposing a portion of the upper surface of the P-type GaN layer;

generating an N-type contact electrode in the first trench;

generating a reflective electrode having a longitudinal cross-section with a wide upper side and a narrow lower side, respectively, on an upper surface of the N-type contact electrode and on the portion of the upper surface of the P-type GaN layer within the second trench;

depositing an insulating layer on a surface of the reflective electrode, and etching the insulating layer to expose the reflective electrodes; and soldering a driving circuit substrate to the reflective electrode.

6. The method of manufacturing the micro-LED display screen according to claim 5, wherein the generating the N-type contact electrode in the first trench comprises generating the N-type contact electrode at bottom of the first trench, to make the upper surface of the N-type contact electrode and the upper surface of the P-type GaN layer at a same height.

7. The method of manufacturing the micro-LED display screen according to claim 5, wherein the depositing the insulating layer on the surface of the reflective electrode comprises depositing the insulating layer on the surface of the reflective electrode, such that an upper surface of the insulating layer is higher than the upper surface of the reflective electrode.

8. The method of manufacturing the micro-LED display screen according to claim 5, wherein a shape of the longitudinal cross-section of the reflective electrode is an inverted trapezoid.

* * * * *